(12) United States Patent
Bäcker et al.

(10) Patent No.: US 9,081,048 B2
(45) Date of Patent: Jul. 14, 2015

(54) METHOD AND DEVICE FOR THE QUALITY CONTROL OF SUPERCONDUCTING BANDS

(75) Inventors: Michael Bäcker, Köln (DE); Jan Wiezoreck, Bonn (DE)

(73) Assignee: BASF SE, Ludwigshafen (DE)

( * ) Notice: Subject to any disclaimer, the term of this patent is extended or adjusted under 35 U.S.C. 154(b) by 549 days.

(21) Appl. No.: 13/395,138

(22) PCT Filed: Aug. 2, 2010

(86) PCT No.: PCT/EP2010/061186
§ 371 (c)(1),
(2), (4) Date: Jun. 19, 2012

(87) PCT Pub. No.: WO2011/029669
PCT Pub. Date: Mar. 17, 2011

(65) Prior Publication Data
US 2012/0249171 A1 Oct. 4, 2012

(30) Foreign Application Priority Data

Sep. 10, 2009 (DE) .......................... 10 2009 040 808
Mar. 15, 2010 (DE) .......................... 10 2010 011 536

(51) Int. Cl.
*G01R 31/10* (2006.01)
*G01R 33/12* (2006.01)
(52) U.S. Cl.
CPC ........ *G01R 33/1238* (2013.01); *G01R 33/1246* (2013.01)
(58) Field of Classification Search
CPC .................... G01R 33/1238; G01R 33/1246
USPC ........................ 324/71.6, 72, 76.11, 691, 713; 505/160–162, 230, 310, 726, 842, 843
See application file for complete search history.

(56) References Cited

U.S. PATENT DOCUMENTS

| 5,223,798 | A | 6/1993 | McGinnis et al. |
| 6,841,988 | B1 | 1/2005 | Bentzon |
| 2006/0073977 | A1 | 4/2006 | Xie et al. |
| 2010/0227765 | A1* | 9/2010 | Ueno et al. ..................... 505/310 |
| 2011/0140710 | A1* | 6/2011 | Ha et al. ......................... 324/537 |

FOREIGN PATENT DOCUMENTS

| EP | 860705 B1 | 9/2006 |
| EP | 1972931 A1 | 9/2008 |

OTHER PUBLICATIONS

Int'l Search Report issued Sep. 29, 2010 in Int'l Application No. PCT/EP2010/061186.

* cited by examiner

*Primary Examiner* — Melissa Koval
*Assistant Examiner* — Daniel Miller
(74) *Attorney, Agent, or Firm* — Panitch Schwarze Belisario & Nadel LLP

(57) ABSTRACT

A method and device for quality control of superconducting bands includes: cooling a section of the superconducting band to a temperature at which said band section becomes superconducting, generating an electrical transport current in the superconducting band section in the longitudinal direction of the band by contacting with a contact assembly, contacting the cooled band section with electrical contacts of the contact assembly, which are spaced apart in the longitudinal direction of the band, in order to form a measurement section over a partial length of the band section, continuously moving at least one part of the band through the contact section and/or measurement section to generate the transport current, detecting a physical measured variable using measurement contacts, wherein the physical measured variable is a measure of the superconducting electrical transport properties of the band section or a part of the band.

21 Claims, 6 Drawing Sheets

METHOD AND DEVICE FOR THE QUALITY CONTROL OF SUPERCONDUCTING BANDS

CROSS-REFERENCE TO RELATED APPLICATION

Figure 1:
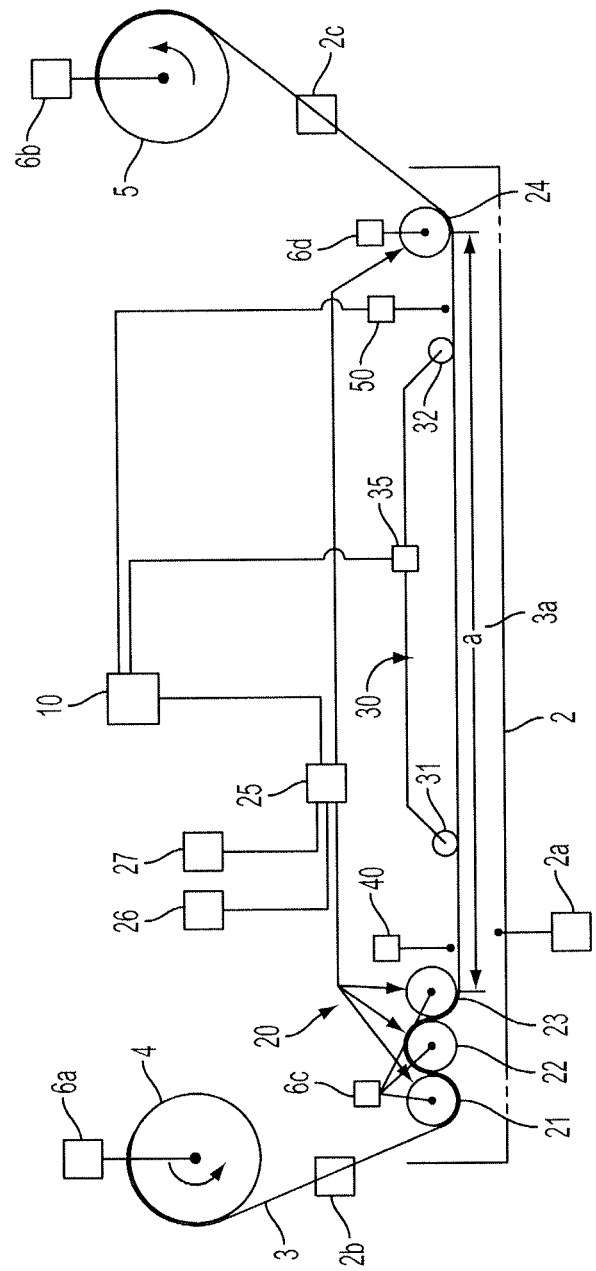

This application is a Section 371 of International Application No. PCT/EP2010/061186, filed Aug. 2, 2010, which was published in the German language on Mar. 17, 2011, under International Publication No. WO 2011/029669 A1, and the disclosure of which is incorporated herein by reference.

BACKGROUND OF THE INVENTION

The invention concerns a method for quality control of superconducting bands, in particular high-temperature superconductor (HTS) bands, in respect of the critical current carrying capacity of the band. The invention further concerns a device for carrying out said method.

The critical transport current $I_c$ is one of the most important parameters of high-temperature superconductor materials for industrial technical applications. In that respect the critical transport current specifies the maximum current at which an electric component is still superconducting, at greater transport current strengths superconduction collapses and the component becomes inoperable because of the electric resistance of the current conduction path, which is increased as a result, wherein the generation of heat that is linked thereto can even lead to destruction of the respective component. For the technical use of superconducting electrotechnical components or devices therefore it is necessary that they are superconducting at least at a critical transport current $I_c$ (min) which is the minimum in dependence on the respective situation of use.

In the industrial production of superconducting bands which is therefore not effected under laboratory conditions, the respective band can suffer to a particular degree from defects which limit the critical transport current. Those defects can be of differing nature, for example in the production of superconducting bands by chemical reactive depositions of the materials due to local non-stoichiometries, locally incomplete reactions of the precursors used, irregularities in respect of thermal decomposition reactions or tempering of the respective intermediate or end products, local defects in the case of epitaxial growth of the superconductor material on the respective substrate and the like. Such defects can limit the critical transport current in such a way that the respective band is to be considered as scrap for the respective purpose of use or however can be used only for lower technical requirements. Quality control of superconducting bands is particularly relevant in that respect when those bands for commercial technical applications are of a great length, for example for the production of superconducting coils or electric supply lines, wherein those bands can readily be of a length of several hundreds of meters or several kilometers.

In addition the method according to the invention aims to be suitable for permitting quality control in the case of superconducting bands which are produced on a large technical scale, for technical applications, so that the method is suitable for permitting quality control in a production process for bands with a production capacity of an installation of several kilometers of band per day.

EP 860 705 B1 discloses a method and a device for measuring the critical current value of a superconductor wire. The superconductor wire (notionally) comprises a multiplicity of longitudinally arranged wire portions. A multiplicity of electric currents of differing current strength is predetermined, wherein a respective current of a respective given current strength is passed repetitively through the respective superconductingly cooled band portion and the voltage generated in the respective wire portion is detected until all current strengths and the resulting voltages for that band portion are detected. Those measurement operations are effected with the band portion being arranged stationarily at the measuring section. The band is then advanced by the length of a portion in order to stationarily position the respective following band portion at the measuring section and to be able to investigate same by applying the multiplicity of current strengths of differing magnitude. By sampling the entire band, band portion by band portion, the individual voltages of the band portions which were respectively obtained by the same electric current $I(m)$ are then added up to obtain a summing voltage. Those summing voltages are ascertained for each electric current of the plurality of different electric currents. The critical current value of the superconducting wire can then be calculated on the basis of a difference voltage.

The method in accordance with EP 860 705 is suitable for investigation of superconductor bands on a laboratory scale but not for production-engineering quality control in which the total production speed of the band including production and quality control of the respective band is at least substantially not to be limited by the quality control procedure. In that respect the production speed of superconductor bands for example by reactive chemical coating with the appropriate buffer and superconductor materials can readily achieve capacities in the region of several kilometers per day for a respective installation. Such a high speed in terms of quality control cannot however be achieved by a method in accordance with EP 860 705 A1.

In addition in production-engineering quality control of superconductor bands it is desirable to locate the defects on the band, that limit the critical transport current, as precisely as possible in order thereby to be able to restore the band, for example by applying a superconducting material in the region of the respective defect or by other suitable measures. That however is not possible with the method of EP 860 705 A1 as here it would be at most possible to ascertain whether there is a relevant defect in a given band portion. That locating operation however would be too inaccurate as then the repair measure would have to involve the entire defective band portion. On the other hand more precise location of the defect is not possible in practice by reducing the length of the respective band portions being investigated, as then, for sufficiently accurate location of the defect, the band portions to be investigated would have to be of such a small length that the band examination time would be unacceptably increased.

U.S. Pat. No. 6,841,988 B1 describes a method and a device for determining the critical current strength of superconducting materials, wherein a superconducting band is transported through a varying external magnetic field. That permits contactless measurement of a magnetic field which is induced in the superconductor band by the external magnetic field. With that contactless measurement procedure the superconductor band is transported continuously through the measuring section. Certain relevant parameters of the superconductor band can admittedly be ascertained by such a method, but quality control in regard to the critical transport current of the band is not possible in that way as the eddy currents generated in the band by the external magnetic field only very indirectly point to defects. Information in regard to the orientation of the defects in relation to the longitudinal direction of the band and thus also a clear reference to a limitation in respect of the critical transport current is not possible in that way.

BRIEF SUMMARY OF THE INVENTION

The object of the invention is to provide a method for quality control of superconductor bands, in particular high-temperature superconductor bands, in respect of the technical usability thereof in relation to current transport, which permits quality monitoring in production processes on a large technical scale and which preferably does practically not restrict the overall production speed in band manufacture upon integration into a production process on a large technical scale.

That object is attained by a method as set forth in claim 1 with features a) through e) and by the provision of a device for carrying out the method as set forth in claim 14. Advantageous developments are set forth in the appendant claims.

To carry out the method according to the invention the band portion which is superconductingly cooled for example in a liquid nitrogen cooling section is contacted with an electric contact arrangement including at least one feed contact and one discharge contact to produce an electric transport current in the longitudinal direction of the band in the band between the contacts. The feed and discharge contacts thus form a contact section in which the electric transport current flows through the band, the transport current flowing through the feed and discharge contacts. The transport current through the band or in the band is thus produced or impressed by the two specified contacts. In addition arranged within the contact section and/or in the transport current producing device (including its feed lines to the band) is a suitable measuring section, by means of which the transport current or a physical parameter which is derived therefrom and/or which is dependent thereon can be detected, which is a measurement in respect of the superconducting transport properties of the superconductor band portion or for the transport current. The transport current can thus also flow through the measuring section. In the simplest case measurement of the magnitude of the transport current can be implemented at the current source producing the transport current, wherein the voltage applied by way of the band is measured/regulated.

More specifically in accordance with the invention arranged within the contact section is a measuring section which can be formed by two measuring contacts which are spaced in the longitudinal direction of the band and which electrically contact the band ("inner voltage contacts" of the contact arrangement). That also permits particularly accurate and reproducible quality monitoring which is also independent of the contact resistance of the current contacts in relation to the superconductor layer (or an electrically conductive cover layer arranged thereon). That avoids faults due to a voltage drop at the current contacts in relation to the superconductingly cooled band, which otherwise would have to be sufficiently low or negligibly slight in relation to the voltage drop across the measuring section.

According to the invention the band (or generally the part of the band, that is to be investigated, the length thereof being a multiple of the length of the band portion cooled at the respective moment in time) is now moved continuously through the measuring section in the longitudinal direction of the band by suitable transport means. During the movement of the band a transport current which progresses in the longitudinal direction of the band is produced therein with electric contacting of the band, the contacts serving as feed and discharge contacts. The transport current produced thus flows unidirectionally in the longitudinal direction of the band at the respective moment in time and causes a (purely) ohmic voltage drop in the band and is not an eddy current.

The contacting operation with the production of the transport current can be implemented continuously during the movement of the part of the band, that is to be investigated, so that the electric transport current progresses continuously through the band or through the part thereof that is to be investigated, over the extent of the respective band portion. The measuring contacts can also preferably continuously contact the band during the movement thereof. The measurement values can be detected continuously or step-wise, that is to say cyclically in respect of time.

It will be appreciated that the region of the band that is to be investigated can involve practically the entire band length, for example only excluding the end band portions, in order for example to mount the band to a transport and/or winding-up device. The investigated part of the band or the band can naturally be a non-integral multiple of the cooled band portion. The term "band" is intended in each case to embrace the part of the band that is to be investigated, the length thereof being a multiple of the length of the band portion which is cooled at the respective moment in time and/or the length of the contact section.

According to the invention moreover a physical measuring parameter is detected on the basis of the produced transport current in relation to the respectively instantaneous contact portion and/or measuring portion of the band, wherein the physical measuring parameter is so selected that it is a measurement in respect of the superconducting electric transport properties (or the transport current) of the band portion or a part thereof. Thus for example a defined, for example constant, electric current can be introduced into the respective band portion for example by way of the feed and discharge contacts of the electrical contact arrangement and the voltage drop resulting therefrom across the measuring section can be detected, and the transport current can therefore be produced in current-regulated fashion. Upon the occurrence of defects however there is the risk of the superconducting current path burning out so that here suitable overload safety devices are to be provided, which automatically reduce the impressed voltage for example when a maximum transport current value is exceeded.

Particularly preferably a defined, for example constant or temporally defined or predetermined, voltage is impressed on the respectively contacted band portion by way of the feed and discharge contacts of the contact arrangement (the transport current is therefore produced in voltage-regulated fashion), in which case then the physical measuring parameter detected is the resulting (ohmic) transport current itself or another suitable physical measuring parameter which has a suitable correlation with the measured voltage drop or the (measured) transport current produced, such as for example electrical resistance or conductivity. That can apply in each case for a current impression effect and/or particularly preferably a voltage impression effect. The impressed or produced transport current (reference value) can correspond to the minimum critical transport current, the maintenance of which is to be monitored over the band length. With the cross-section of the superconducting layer of the band being known, the critical current density can also be used in each case instead of the critical current strength. A particular advantage of voltage-regulated measurement over measurement with a predetermined transport current is on the one hand the point that burning-out of the conductor in the event of defects is reliably avoided. Furthermore, with voltage-regulated measurement there is no need for the conductor to be provided during the measurement operation with an electric shunt (that is to say a sufficiently thick, low-resistance protective layer which discharges an electric current from the superconductor material which is no longer in a superconducting state, to a sink or ground). The method according to the invention therefore also concerns quality control of superconducting bands which are not provided with an electric shunt, in particular also superconducting bands for the production of current limiters (FCL). A further advantage of the method according to the invention is that measurement of the transport current or the parameter which is dependent thereon does not have to be effected with use of a comparatively high external magnetic field. Thus in principle in the case of measurements with a constant current the critical current of the superconductor can be reduced by the application of an external magnetic field to such a degree that the measurement current, even when the critical current is exceeded, is not sufficient to cause burn-out of the conductor. However a relatively strong external magnetic field is then generally required, for example of 0.6 T (Tesla). On the one hand however the properties of the superconducting material in the case of such a strong external magnetic field are not relevant for many applications, while on the other hand, with such strong magnetic fields, particularly when dealing with ferri- or ferromagnetic substrates and particularly with continuous measurement, very high band forces are exerted on the band, which require complicated band guidance through the external magnetic field. In addition, when dealing with wide bands, the magnetic field must also be very homogenous over the entire width of the band. All those disadvantages do not occur with the method according to the invention. The invention therefore also concerns a method for quality control of superconducting bands on a ferrimagnetic and/or ferromagnetic substrate, for example an Ni alloy, wherein further layers such as for example buffer layers which can comprise oxidic materials can be provided between the substrate and the superconducting layer. The method according to the invention thus makes it possible to investigate bands of a width of $\geq 1$-2 cm or $\geq 5$-7 cm or $\geq 9$-11 cm, and the bandwidth can be $\leq 13$-15 cm or $\leq 9$-11 cm.

In general in accordance with the invention production of the transport current can be effected in each case in voltage-regulated fashion, wherein the resulting (idealized) transport current can be constant or time-dependent. The voltage can be regulated to a constant or a time-dependent value. The description in relation to a time-dependent transport current (for example transport alternating current) relates to an idealized transport current (that is to say without irregularities due to irregularities in the superconductor material) and can then respectively apply in accordance with the invention directly also for the voltage producing same, such as for example in respect of the time dependency profile (sinusoidal, sawtooth and so forth), frequencies and the like. Alternatively the description can also relate in each case to the regulated transport current, in which case then for example the voltage drop can be the measuring parameter.

The method according to the invention thus makes it possible to continuously check the superconductor band (or a part thereof) in the respective production process to ascertain that the specified requirements in regard to the minimum critical transport current to be implemented are met. That checking operation can be effected in integrated relationship in the respective production process so that the method according to the invention (or the device for carrying out same) is directly part of a continuous production process (or installation) for the band, or can possibly be operated independently thereof at at least substantially the same or a higher speed (in relation to band length in relation to time) as the production installation, for example including in a bath mode. For that purpose for example a band of a given length can be wound up and the band coil is then subjected to the method according to the invention at a later moment in time. There is therefore no longer any need, as for example in accordance with EP 860 705 A1, to investigate a respective band portion when the band is arranged stationarily, to position the band portion which follows in the longitudinal direction of the band at the measuring section and in turn to investigate same with stationary positioning thereof at the measuring section, in regard to its current-voltage characteristic. The method according to the invention can thus be carried out substantially more quickly. In addition the band can be continuously moved on during detection of the physical measuring parameter so that positive or negative accelerations of the band, as are necessary in the case of the stationary measurement, are minimized or are completely unnecessary, whereby mechanical loadings on the band, which can lead to band defects, are also avoided.

In addition in accordance with the method of the invention it is only still necessary to monitor whether the predetermined minimum critical transport current Ic (min) is maintained over the entire band length (or the part of the band, that is to be monitored), wherein there is no need to record a complete current-voltage characteristic of the respective band portions or the entire band. In that respect a particular advantage of voltage-regulated measurement is that only one measuring run is required to ascertain the actual critical current Ic for each measuring location, that is to say for each region of the band, that is to be measured.

Advantageously a current Ic (min) defined as the minimum critical transport current is fed in the form of a continuous current into the band by way of the contact section (that is to say between the feed and discharge contacts) so that only the voltage drop or a physical parameter derived therefrom is measured over the measuring section, in order to detect whether the criterion for superconduction is sufficiently observed over the contact and/or measuring section. The current Ic (min) can therefore be of the level of the critical transport current that the profile investigated in accordance with demand is to involve. The fed-in current can generally be selected in accordance with the invention in such a way that the voltage drop across the contact section is in the range of 0 or 0.001 or between 0.01 and 25 $\mu$V/cm, between 0.05 and 10 $\mu$V/cm or between 0.1 and 5 $\mu$V/cm or in the range of between 0.5 and 3 or is about 1 $\mu$V/cm.

The method according to the invention can generally be carried out in such a way that such an electric transport current is produced, which, in the superconducting band portion, at the measuring section, is less than/equal to a predetermined reference value which signifies a sufficiently high critical current strength for the respective situation of use, for example a voltage drop of up to between 5 and 10 $\mu$V/cm, preferably up to between 1 and 2 $\mu$V/cm or up to between 0.5 and 0.75 $\mu$V/cm or up to between 0.1 and 0.2 $\mu$V/cm. In the method according to the invention the band can be moved through the measuring section at a band speed of between about 0.5 and 50 m/sec, possibly also at a lower or higher speed.

Quality control of the entire band (at least from a reference point) or the part to be investigated, in particular therefore also the pass through the contacting and/or measuring section, can be effected at a constant transport speed for the band, which can differ from the average band speed for example $\leq \pm 30$-50%, $\leq \pm 10$-20% or $\leq \pm 3$-5%. Preferably the band speed is detected or measured during implementation of the method, at least from a predefined reference point, preferably in time-dependent mode over the duration of the method, and/or the passage time of the band as from a predetermined reference point on the band, from which control is effected. In that way the method can be carried out in such a fashion that positioning of the contact and/or measuring section in relation to the respective local band portion can always be appreciated even after conclusion of the investigation procedure.

Preferably the physical measuring parameter is detected continuously during the movement of the band, in particular by way of a movement of the band, that is a multiple of the band portion length. The method according to the invention is in principle not limited to given band lengths, the length of an individual band can thus readily be ≥200-500 m, ≥1,000-2,000 m or ≥5,000 m, without being restricted thereto. The band length (or investigated portion length) can thus be ≥100 times or ≥200-500 times or ≥1,000-5,000 times the length of the cooled band portion. The method according to the invention makes it possible to provide a through-passage of more than 1-5 kilometers of band length per day (km/d), but readily also ≥5-20 km/d or ≥20-50 km/d, readily up to 50-100 km/d or above, and in that case the through-passage can correspond to the band speed. The band speed through the measuring section can be for example between about 0.1 m/sec and about 50 m/sec.

In addition the method according to the invention permits at the same time simple fast detection and/or positional location of the defects in the band or the part thereof that is being investigated, that limit the critical transport current Ic (or that lead to the current falling below the required minimum transport current Ic (min)), wherein positional resolution in terms of locating the defects is greater than the length or between ¼ and ½ or between ⅛ and 1/16 of the length of the contact section (with a plurality of feed and/or discharge contacts for producing the transport current that is to be measured (indirectly) including all contacts or possibly a very small spacing in respect of the feed and discharge contacts). When the respective defect passes into the contact section and/or the measuring section due to band transport the respective physical measuring parameter alters significantly, for example there is a drastic rise in voltage or a drop in the transport current, possibly as far as collapse of superconduction. The band portion in the region of the local defect can then be directly marked by suitable means or, if the transport speed of the band is known, the defective band portion can be located after investigation of the entire band if for example the physical measuring parameter is detected in time-dependent relationship (in the case of a changing band transport speed the time dependency of the band speed is then also to be ascertained). The defective band portion can then be locally restored in specifically targeted fashion in order to be able to observe the required critical transport current over the entire band length. In accordance with the method of EP 860 705 A1 in comparison it is only possible to establish whether a given band portion is suffering from a defect. As however that band portion must be of a length which is as great as possible in order to minimize the number of individual measurements so that the method is still practicable at all when great band lengths are involved, the entire band portion in practice has to be separated out of the band or bridged over, which however is highly disadvantageous.

The physical measuring parameter is preferably detected continuously during the movement of the band under the contact and/or measuring section so that the entire portion of the band that is to be investigated or the entire band is passed through the contact and/or measuring section without the band stopping, the measuring parameter being detected in that operation. The physical measuring parameter can in that case possibly also be detected in time-cycled relationship. Time cycling is also to be determined in dependence on the desired positional resolution for location of the local defects limiting the critical transport speed and/or can be used for positional resolution. Time cycling can be so selected that the spacing in respect of time between two measurement results of successive portions of the band is less than the quotient of the length of the measuring section and the band speed when passing through the measuring section. The time range between two measurement results without detection of the physical measuring parameter can generally be <1 or ≤ between ½ and ¼, ≤ between ⅛ and 1/16, ≤ between 1/32 and 1/64 or ≤ between 1/200 and 1/500 of the quotient of the contact section or measuring section length and band speed (which is indirect or which is instantaneous in measurement value detection). In that case the contact or measuring section length is defined by the spacing of the respective contacts in the longitudinal direction of the band. Thus a large number of measurements can be detected when a band portion passes through the measuring section so that it is possible to achieve a correspondingly high level of positional resolution for locating the respective defects when the measuring parameter is detected and evaluated with the number of cycles. In that case the measuring contacts can permanently contact the band or can possibly be brought into contact with the moving band with the time cycling.

The defined electric transport current which is introduced into the band by means of the electric contact arrangement with the continuously moving band can be of a constant level, in which respect fluctuations within certain limits such as for example ≤±10-20, ≤±5-7 or ≤±2-3% or ≤±1 of the reference value may be admissible. Preferably the defined current introduced is a continuous current. The continuous current can thus be uninterrupted over the period of carrying out the method according to the invention at the respective band or part thereof or may not fall below the minimum critical transport current to be observed.

The defined transport current produced in the band can possibly also change continuously in respect of time, for example increasing or decreasing over the period of time in which a band portion of the length of the contact or measuring section respectively passes therethrough, the change may be linear or non-linear.

The electric transport current in the cooled band portion can be produced in the form of an alternating current, on the basis of which the physical measuring parameter is detected. The alternating current may alter periodically or aperiodically. Unless otherwise stated the term "transport current/transport alternating current" refers to an idealized current, that is to say without having regard to irregularities in the transport current due to irregularities in the band material, in particular superconducting material. The alternating current (in particular also periodic or aperiodic) is particularly preferably produced in each case by an impressed (regulated) ac voltage which can change periodically or aperiodically. The description in relation to transport current respectively also applies in regard to the impressed voltage producing the transport current, in particular in regard to the kind of time dependency (sinusoidal, sawtooth, etc., frequency and so forth).

The alternating current can be an alternating current which is superposed on a base current, for example a constant or changing base current, in the manner of current strength modulation, which does not have to lead to changes in polarity at the feed/discharge contacts (a corresponding consideration also applies to the ac voltage producing the transport current). The change in the transport current and/or the regulated voltage can be effected in accordance with the nature thereof generally for example sinusoidally, in sawtooth form, trapezoidally, in triangular form or rectangular form or with another suitable profile. The period and/or amplitude of the alternating current and/or the ac voltage can be constant over the investigated part of the band or can change independently of each other in defined relationship. What is crucial in each case is that the change in current/voltage is defined or can be determined, for example by suitable measurement, and preferably leads to a proportional or generally defined and predictable change in the physical measuring parameter, which is to be detected by means of the measuring section so that defects can be detected. A corresponding consideration also generally applies for other physical parameters, by which a continuous transport current is produced in the measuring section, on the basis of which the respective physical measuring parameter can be detected, for example when a voltage is impressed.

Preferably in that case an electric transport alternating current (or a current strength modulation) is produced, whose frequency (modulation frequency) is greater than/equal to the quotient of (i) the speed of the moving band and (ii) the length of the contact section and/or the measuring section or generally the length of the band region over which the physical measuring parameter is determined at a given moment in time. A corresponding consideration preferably applies to the impressed ac voltage by which the electric transport current is produced. For that case, there is then (ideally) a corresponding transport alternating current which is subject to corresponding fluctuations upon irregularities in the superconducting material. The band speed can be the average band speed or the instantaneous speed of the band when passing through the contact or measuring section. The fact that the frequency is greater than the above-mentioned quotient means that it is possible in a certain fashion to achieve positionally resolved characterization of the respective band portion in regard to locating defects and the influence thereof on transport current limitation. On the other hand the frequency should not be too high to be able to minimize any time relaxation phenomena in regard to the production of the electric transport current, any secondary effects such as for example unwanted production of magnetic fields, or the like. The changes in the physical measuring parameter, which occur because of the transport alternating current, are detected at the measuring section.

The frequency of the electric transport alternating current or the ac voltage producing same can be in the range of between 0.05 and 100 Hz, preferably in the range of between 0.1 and 200 Hz or in the range of between 0.2 and 100 Hz, particularly preferably in the range of between 0.5 and 50 Hz or in the range of between 0.5 and 25 Hz, particularly preferably in the range of between 1 and 10 Hz, for example about 5 Hz. The frequency can also be up to 1,000-2,000 Hz or up to 5,000 Hz or more if falsification of the measurement results for example due to unwanted eddy currents is sufficiently slight.

Particularly preferably that transport alternating current/ the impressed ac voltage can be superimposed on a transport current (base current)/base voltage which is constant or which changes continuously in dependence on time, wherein the physical measuring parameter is detected on the basis of the resulting superposed transport current. For that case preferably the strength of the base current/level of the voltage is greater than the maximum amplitude of the superposed transport alternating current/ac voltage so that there are no reversals of polarity at the input and discharge contacts of the contact arrangements. For example the amplitude of the transport alternating current can be ≤98%, ≤80-95% or ≤70-80% or ≤40-60% or ≤10-20% of the current strength of the constant transport current produced, a corresponding consideration applying for the voltage amplitude/constant voltage. In that case production of the respective transport current can also be effected either in current-regulated fashion or however also in voltage-regulated fashion, preferably in accordance with the regulation of the base current.

Production of the transport alternating current (possibly with the superpositioning of a base current), particularly preferably by means of a regulated ac voltage, provides that, with a continuously moved band, it is possible to produce a kind of current-voltage characteristic of the respective band portion or ultimately the band overall, which in comparison with determining a current-voltage characteristic when the band is stationary, because of the band speed in the measurement operation, admittedly has a certain degree of lack of sharpness. Nonetheless it is possible in that way, in the context of quality control, to obtain locally more specific information in relation to the critical current strength of the respective band portion associated with the section. It is thus possible in that way to approximately determine the gradient of the current-voltage characteristic of a band portion, that is to say the n-value in describing the characteristic with an exponential function.

Thus not only the critical minimum transport current to be fulfilled can be monitored by the variation in the current strength in the expected range or the range to be investigated in respect of the (possible) critical current strength (preferably by means of regulated voltage), but it is also possible in accordance with the amplitude level of the transport alternating current, to provide information about observance of critical currents in a current strength range, depending on the respective minimum and maximum current strength of the transport alternating current.

If therefore a local defect detects a current peak in the alternating current, the transport current is limited to a lower value which however can be higher than the minimum critical transport current, and that leads to a corresponding change in the detected measuring parameter. It is then also possible to determine the position of the local defect on the band by way of the number of periods of the transport alternating current, which is detected and which is involved as from a predefined reference point on the band. In that case it is assumed that such defects which limit a critical transport current $I_c$ which is greater than the minimum critical transport current of the band overall, is arranged ultimately in statistically distributed relationship in the band, both as corresponds to the local distribution thereof over the band and also the nature of the respective defects in respect of their "interference energy", that is to say the limitation thereof on the level of the critical transport current. It will be appreciated in that respect that the respective defects can be defects which are more or less "severe" or "slight" and which for example cause more or less severe lattice defects or electronic defects in the high-temperature superconductor layer and thus can more or less severely limit the critical transport current. In that way therefore it is also possible to provide for more extensive quality characterization of the band overall. In addition the inductive component of the voltage drop measured at the band can be altered if required by the choice of the current pattern of the alternating current produced.

If the transport current or the voltage producing same is produced with an alternating current component (or an ac voltage component) which can be superposed with a "base current" of constant current strength or a base voltage, then the voltage drop measured at the band comprises a resistive and an inductive component. The resistive component occurs due to the voltage drop at the superconductor band with a direct current, that is to say the desired signal in relation to band quality control. A second component of the voltage drop is caused by the current which changes in relation to time and which produces so-called AC losses in the band. Those AC losses can be estimated by computation, which can be effected before the commencement of measurement, for which purpose the device according to the invention includes a computer. The estimation operation can be effected on the basis of the frequency and amplitude of the alternating current produced and the properties of the superconducting band to be investigated such as its geometrical dimensions, conductivity, alternating current resistance and so forth. Measurement of the physical measuring parameter can be effected in accordance with the invention in such a way that the AC losses do not have any substantial influence on determining the local critical current Ic (loc). In that respect falsifications of the true critical current which is measured with a pure direct current in respect of the transport current of ±20% or ±5-10% or ±1-2% are possibly acceptable. To keep the AC losses low the amplitude and frequency of the alternating current component can be selected to be correspondingly low.

For determining the critical current strength Ic (min) as accurately as possible, with an alternating current component in the measurement procedure, the measuring lines for taking off the voltage can be such that the inductive measurement voltage is minimized. For that purpose the electric connections between the feed and discharge contacts of the contact arrangement and/or between the two contacts defining the measuring section can be of such a configuration that they produce equally strong induced magnetic fields on both sides of the measuring section. Alternatively or additionally there can be provided one or more compensation coils which produce magnetic fields, wherein the magnetic field strength can be so set that the inductive component of the measuring signal is minimized. Adjustment of the magnetic field strength can be effected empirically, or by computation means.

Alternatively it is further possible to compensate by computation for the inductive component of the voltage drop because of the transport alternating current produced, for example by means of measurement and/or with knowledge of the change in respect of time of the transport current dI/dt. The inductive component of the current drop can thus be subtracted by computation from the measurement signal, for example by means of a microcontroller operating on the basis of the principle of analog/digital (AD) conversion.

Advantageously there is provided a device for producing a magnetic field which passes through the superconductor band in the region of the contact and/or measuring section, wherein the magnetic field is arranged transversely, preferably perpendicularly, to the longitudinal direction of the band. Preferably the magnetic field is arranged transversely or perpendicularly, for example at an angle of 45-135° or 70-110° or about 90°, relative to the band surface or the longitudinal direction of the band. If the band or the superconductor layer has a main plane (for example parallel to the plane of the band) then the magnetic field is preferably arranged perpendicularly to the plane of the superconductor layer (optionally with the above-mentioned deviations from the normal). The magnetic field is thus arranged relative to the band in the region of the contact and/or measuring section such that it causes the transport current to be constricted to a cross-section less than the geometrical cross-section of the superconductor layer of the band. The current-constricted region then forms the actual measuring section as the transport current is limited thereby. The physical measuring parameter can then be detected in the region of the band with the constricted transport current cross-section. Thus the external magnetic field means that a lesser transport current through the band is necessary to acquire the respective information in relation to the quality or properties of the superconductor layer. The region of the (homogenous) magnetic field can be limited to the measuring section, preferably the extent of the (homogenous) magnetic field in the longitudinal direction of the band is less than the length of the contact and/or measuring section. The feed, discharge and/or measuring contacts can thus be arranged outside the magnetic field. The magnetic field can be homogenous over the extent thereof in the longitudinal direction of the band. The magnetic field can therefore extend over the length of the contact or measuring section, but for the above-specified reasons it preferably extends in each case only over a portion thereof.

The transport current or critical transport current can further be detected by the measuring arrangement in dependence on the magnetic field strength. To avoid alternating magnetic fields, various regions of the cooled band portion can for that purpose have magnetic fields of differing strengths, which are preferably constant, passing therethrough. In that way further important quality criteria about the superconductor layer can be obtained, for example information about the transport current in dependence on the strength of the external magnetic field.

The magnetic field can be in particular a stationary field. The magnetic field strength can be in the range of between 0.001 Tesla and 10 Tesla (with respect to the component perpendicularly to the band, preferably perpendicularly to the superconductor layer), without being limited thereto, for example in the range of between 0.05 and 1 Tesla or in the range of between about 0.1 and 0.2 Tesla or up to 0.3 or up to 0.5 Tesla. In particular the magnetic field strength can be in the range of for example between 0.001 Tesla and for example 0.5 Tesla or up to 0.4 Tesla, in particular ≤0.25-0.3 Tesla or ≤0.2-0.15 Tesla. The magnetic field strength can be ≥0.001 Tesla or ≥0.005-0.01 Tesla or ≥0.015-0.02 Tesla or ≥0.05 Tesla. The magnetic field can be respectively produced by a permanent magnet, by magnet coils or other suitable devices.

In particular the method can be carried out in the transitional region from the superconducting state into the non-superconducting (normally conducting) state of the superconducting band. For that purpose for example it is possible to produce a transport current which changes in respect of time (transport alternating current), the minimum value of which is in the superconducting state and the maximum value of which is in the normally conducting state of the superconducting material or in the transitional region between them. The alternating current can be produced in particular in voltage-regulated fashion, for example with an ac voltage which can for example sinusoidal or can be of a sawtooth profile. The external magnetic field could possibly also be varied in time-dependent relationship so that, with a low magnetic field, the superconducting state applies while with a high magnetic field the normally conducting state or a transitional state occurs. Here the term "transitional state" is used to denote such a state with partial loss of superconduction. Implementation of the method in that way is possible in particular when investigating HTC band material for resistive current limiters and similar applications, it can be carried out in such a way that the steepness or width of the superconductor-normal conductor transition can be ascertained thereby. The gradient $\Delta x/\Delta y$ can be for example specified by a $\Delta I/\Delta t$ or by a $\Delta U/\Delta I$, wherein $\Delta$ is the current or voltage difference between the state which is just still superconducting and just already normally conducting, U is the voltage producing the transport current and t is the time, over which there is a change in voltage, in which respect in both cases $\Delta U/\Delta t$ is preferably respectively constant, and wherein I is the transport current.

Preferably there are provided a plurality of electric contacts of the same polarity as feed contacts, for example 2, 3 or 4 or more, which at the same time are or can be applied in electrically contacting relationship to the band in order to feed a plurality of partial currents into the band to produce an electric transport current in the band. Various developments in the method are possible in that way. On the one hand a plurality of feed contacts which can be simultaneously applied to the band and which contact the band during its movement in the longitudinal direction thereof can be associated with a discharge contact (or group thereof). The measuring section can then be arranged between the feed contact next adjacent to the discharge contact and the discharge contact (which is first in the band transport direction). In that way the transport current which is introduced into the band and on the basis of which the physical measuring parameter is detected is not limited by the contact resistance between the feed contact and the band in the band movement or other apparatus or method aspects and in particular high band speeds are possible, with a high transport current.

It is also possible to provide two or more contact arrangements which respectively include electric feed and discharge contacts for producing a respective independent electric transport current in the respective region of the band portion and respective electric measuring contacts, forming a measuring section. Those two or more respective contact arrangements can be simultaneously applied in contacting relationship to the band during band transport. In that way a plurality of independent transport currents can be produced at the same time in various regions of the cooled band portion, wherein the physical measuring parameter is detected in the various regions of the band portion, with association with the respective transport currents, independently of each other. The transport currents introduced into various regions of the cooled band by means of the various contact arrangements can be of the same level, for example to permit more precise quality control. Preferably respective transport currents of differing current strength are produced in the band by the various contact arrangements, the respective physical measuring parameter being detected on the basis thereof. In that way it is possible at the same time to determine the dependency of the respective physical measuring parameter on the level of the transport current strength, or to determine whether the band complies with the reference value not only in respect of one but in respect of a plurality of different critical transport current strengths in order in that way for example to be able to associate the band with various qualities A, B and so forth. The various transport currents can be produced at the same time or independently or in succession in respect of time in the respective cooled band portion so that a transport current B is produced only when a transport current A, with associated detection of the physical measuring parameter, was already interrupted or set to 0 in order to exclude mutual influences in respect of the measuring currents.

If there are provided two or more feed contacts which are at a certain spacing from each other in the longitudinal direction of the band, then it is possible by means thereof to implement location of defects limiting the (minimum) critical transport current. If in transport of the band a defect passes into the region between the first and second feed contacts, wherein the first feed contact is furthest away from the discharge contact, then the first feed current for producing the transport current and therewith the transport current is overall interrupted or reduced. That can already be detected in the measuring section of that contact arrangement. The defect can be thus be located between the first and second feed contacts. If the defect, due to band transport, passes into the region between first and second feed contacts, the second feed current is then also interrupted or reduced, and so forth. The position of the defect can be located on the band directly or with knowledge of the moment of measurement and the band speed. The plurality of feed and/or discharge contacts however can also be arranged in immediate succession on the band.

The respective contact arrangement can possibly have a plurality of discharge contacts. They can ensure that the entire current which is fed into the band is discharged by way of the discharge contacts applied to the superconductingly cooled band portions.

Preferably the band speed when the transport current is being fed into the band is between about 0.1 and 20 m/sec, preferably in the range of between 0.5 and 10 or between 0.5 and 5 m/sec. That makes it possible on the one hand to implement a sufficiently high speed for the method according to the invention overall, while on the other hand contacting problems at excessively high band speeds are limited.

The above-mentioned ratio of the frequency of the produced transport alternating current to the quotient of (i) the band speed of the moved band and (ii) the length of the measuring section in the longitudinal direction of the band, which is respectively associated with the given band portion, and/or the length of the contact section over which the transport current is produced, can be $\geq 1$ or $\geq 1.01\text{-}1.05$ or $\geq 1.1$, preferably $\geq 1.5\text{-}2$ or $\geq 3\text{-}5$ or particularly preferably $\geq 10\text{-}15$ or $\geq 20\text{-}50$, for example $\leq 100\text{-}200$ or $\leq 300\text{-}500$ or $\leq 1,000\text{-}2,000$ or $\leq 5,000$. That makes it possible to minimize inductive losses and falsifications of the measurement results.

The contacts forming the contact section and/or the measuring section can be at a spacing in the range of 0.2-20 m or 0.5-15 m, preferably in the range of 1-10 m, without being restricted thereto. The measuring section length however can possibly also be of greater or lesser lengths, excessively long measuring sections suffer from the disadvantage that this increases the risk of burn-out of the band because of existing defects. The spacing of the feed and discharge contacts is generally greater than the length of the measuring section, wherein the measuring contacts be arranged within the contact section.

The respective contact arrangement can respectively comprise, in the manner of a four-point measuring arrangement, a feed contact and a discharge contact as well as two measuring contacts arranged between them so that the two measuring contacts do not have current flowing therethrough (in regard to production of the transport current). That can apply in particular when impressing a voltage and measuring the current strength. The contact arrangement can also be designed for example in the fashion of a three-point arrangement so that one of the two measuring contacts serves at the same time as a feed contact or preferably at the same time as a discharge contact. Other suitable contact arrangements can possibly also be used.

When detecting a defect which limits the critical transport current either the local band region having the defect can be marked by suitable means, for example by notching the band or the superconductor layer. After the entire band has been checked that marked position can be located and restored. Marking can also be effected indirectly by detecting the transport speed of the band and the time of the band advance movement from a reference point continuously, for example with sufficiently close time cycling, so that the defect can be located again in that way after carrying out the method according to the invention. Optionally the respective local defect can also be cut out immediately after detection or, if the respective band portion has left the cooling section and band transport can be interrupted in order to repair the defective band portion or the repair can be effected immediately in each case with band transport continuing. To repair the band the defect can generally be cut out of the band or the superconductor layer, in which case the two regions adjacent to the defect are then joined by a low-ohmic joint. Alternatively a fresh portion of superconducting material can be applied to the superconductor layer and that can be electrically reinforced to such an extent that the required critical current strength is also fulfilled at that portion of the band.

Particularly preferably the feed and/or discharge contacts and/or the measuring contacts of the contact arrangement are of such a configuration that they are applied over a lengthwise region of the band which in each case goes beyond local contacting or contacting in point form. In that case the contacts can bear against the band in line form (in the longitudinal direction of the band) or in areal relationship. Preferably for that purpose the contacts are in the form of rollers or sliding contacts, wherein to provide contact regions the band can bear against the rollers over part of the periphery, the band can also extend around the contact rollers over part of the periphery. That provides good electrical contact at high band speeds and slippage between the band and the rollers can be avoided. In that case the rollers can either be driven independently by suitable drive means or they are moved passively, in which case the band is transported in the longitudinal direction thereof by other transport means, for example by a winding-up and unwinding reel which can each be driven independently of each other to transport the band through the cooling section and the measuring section. Further transport means for the band, for example in the form of transport rollers, can possibly also be provided, in which case the above-indicated description can correspondingly apply. The band can be advanced in frictional engagement in each case between two oppositely disposed rollers. The band can be guided between oppositely disposed rollers which bear against the top side and the underside of the band. In that case the band can be guided in a straight or preferably arcuate or meandering configuration around or between the rollers. The band can bear against the respective roller through a peripheral portion of $\geq 10\text{-}20°$, preferably $\geq 30\text{-}45°$ or $\geq 60\text{-}90°$, possibly also up to $120°$ or up to $180°$ or more. The respective rollers can possibly be in the form of pressure rollers and pressed against the band by suitable pressing means to minimize slippage of the band relative to the rollers. In particular there can be provided a plurality of such feed rollers or feed contacts with feed contacts which are areal or in line form in the longitudinal direction of the band and which embrace the band closely and possibly without any intermediate space. The shaft bearings of the rollers can each be arranged outside the cooling section. To produce the transport current it is possible to provide a regulatable voltage source, by means of which the transport current can be produced in voltage-regulated fashion.

In general it should further be noted that a "superconductor band" or "high-temperature superconductor band" in accordance with the invention is a band having a (high-temperature) superconductor layer which can be arranged on a suitable substrate which can be biaxially textured. The substrate can be in particular ferrimagnetic or ferromagnetic. One or more buffer layers or other intermediate layers can be applied between the superconductor layer and the substrate, which layers permit for example biaxially textured growth of the HTS layer on the substrate and/or can serve at the same time as a diffusion barrier. The expression "contacting of the band" in accordance with the invention is then used generally to denote contacting of the superconductor layer which is continuous in the longitudinal direction of the band, if a transport current cannot also be produced in the superconductor by contacting of the substrate. The substrate is not limited to particular compositions, but in particular it can be a nickel alloy, in particular a W-bearing Ni alloy which can contain $\geq 1\text{-}2$ or $\geq 5\text{-}10$ weight of W. The high-temperature superconductor material is not limited to given materials, they can be in particular ceramic superconductors, for example of the Y—Ba—Cu or Bi—Sr—Ca—Cu type or the like. In that respect the term high-temperature superconductor is used to denote a material which has a transition temperature above 77 Kelvin, but the method is not limited to that. After quality control the superconductor band can be subjected to further production steps, for example an arrangement of cover layers or the like. The method according to the invention and the device are adapted in particular to be able to investigate high-temperature superconductor materials produced by reactive chemical deposition. The superconductor layers however can also be produced in any other fashion, for example by gaseous phase deposition, sputter procedures or the like. The term "band" in accordance with the invention is not intended to be limited to given cross-sectional geometries, there can be any suitable cross-sections like wires or the like if the length of the respective band is a multiple of the width thereof.

BRIEF DESCRIPTION OF THE SEVERAL
VIEWS OF THE DRAWINGS

Figure 2:
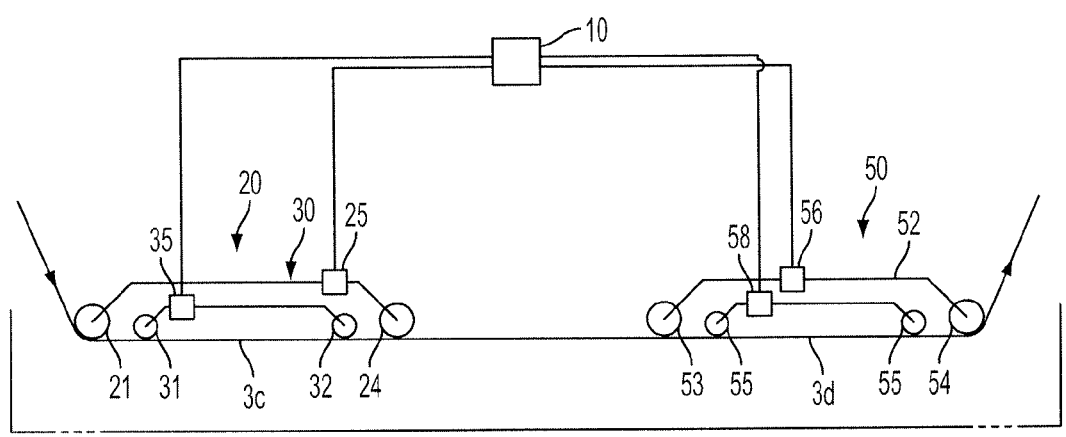
Figure 3:
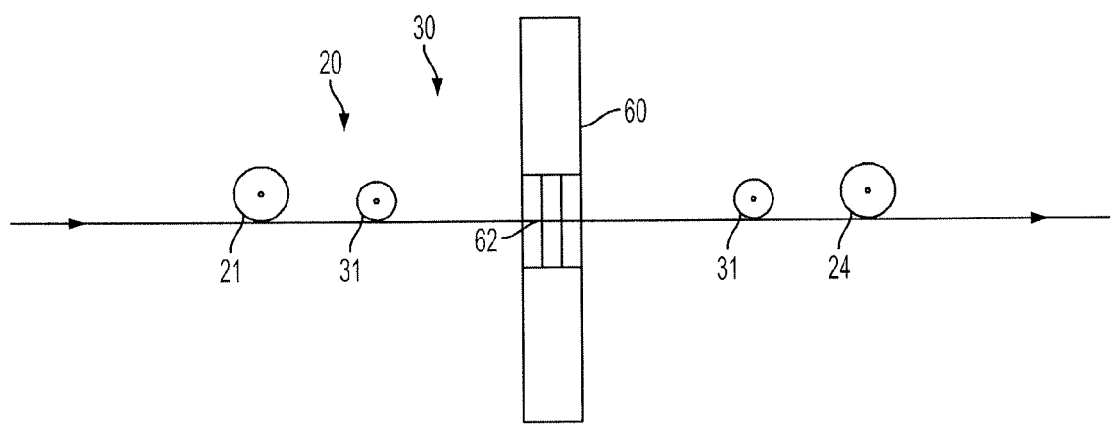
Figure 4A:
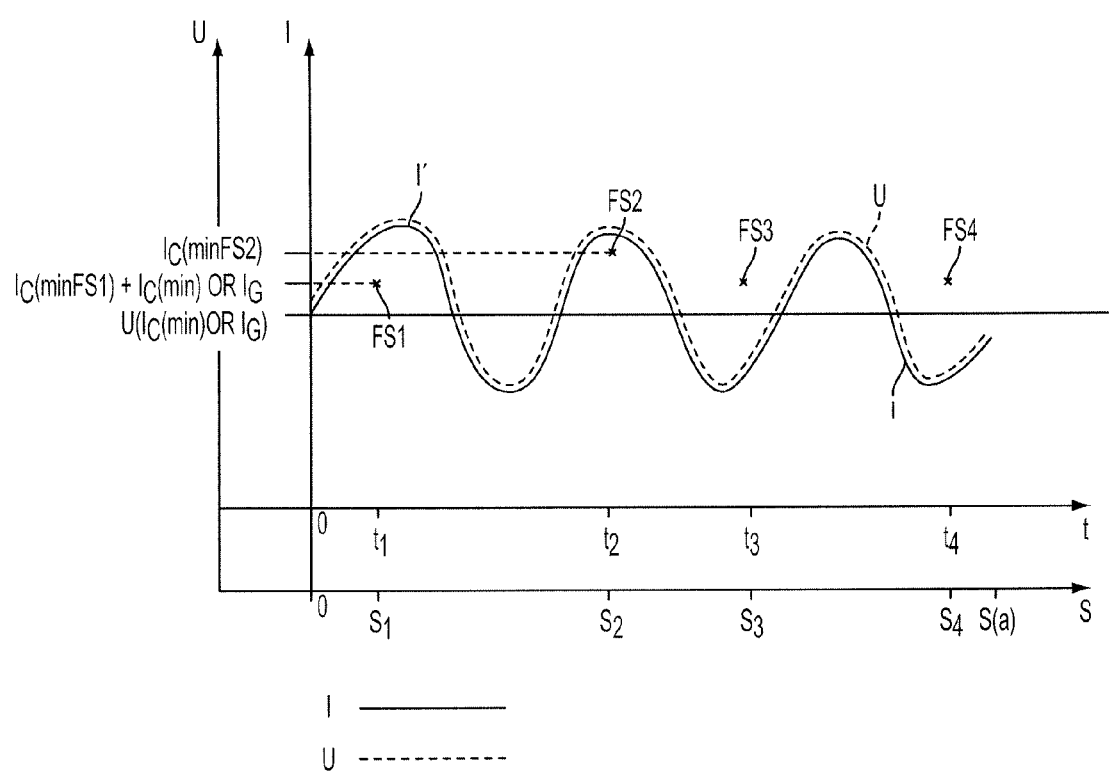
Figure 4B:
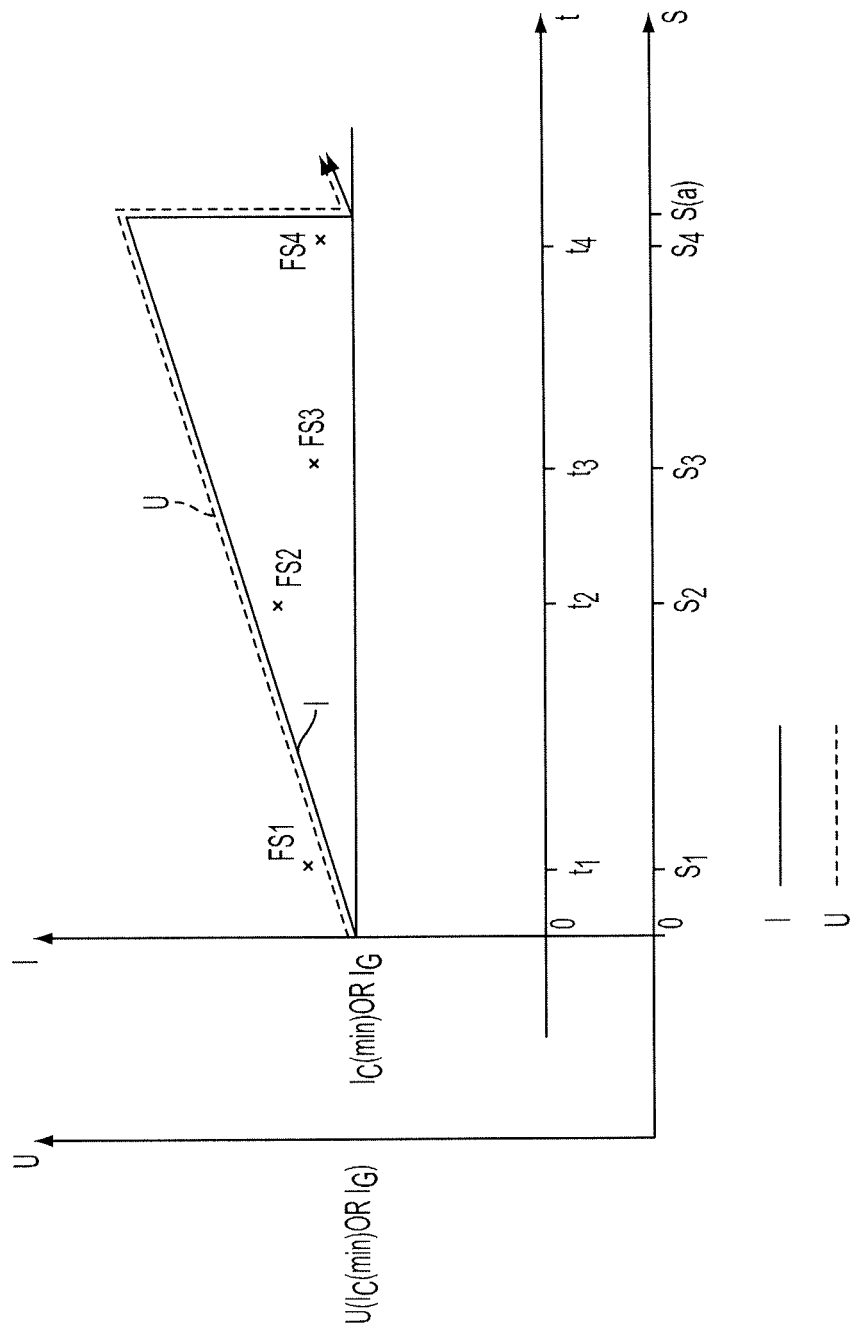
Figure 5:
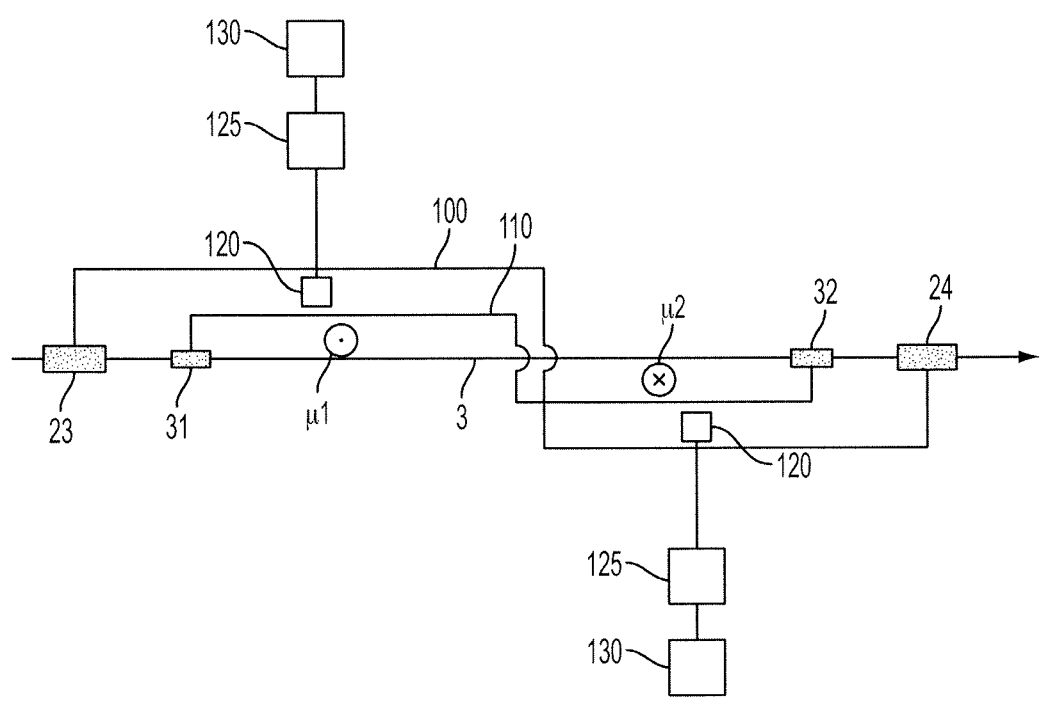

The invention is described and explained hereinafter by means of an embodiment by way of example. In the drawing:

FIG. 1 shows a diagrammatic view of a device for carrying out the method according to the invention, FIG. 2 shows a side view of a contact arrangement in accordance with a development of the device of FIG. 1, FIG. 3 shows a side view of a development of the device of FIG. 1 with an external magnetic field, FIG. 4 shows diagrams of a transport current with respectively superposed sinusoidal or sawtooth alternating current component in relation to time in the presence of defects in the superconductor layer, and FIG. 5 shows a diagrammatic plan view of a contact arrangement of the device according to the invention as shown in FIG. 1.

DETAILED DESCRIPTION OF THE INVENTION

Referring to FIG. 1 the device 1 for carrying out the method according to the invention for quality control of (high-temperature) superconductor bands has a cooling section 2 for cooling a portion 3a of the band 3 to a temperature at which that band portion becomes superconducting. For that purpose the cooling section 2 can have a suitable cooling agent such as for example liquid nitrogen through which the band can be passed. The cooling section can further have a temperature monitoring device 2a which communicates the ascertained temperature of the cooling section and/or the band to a central control device. Devices for controlling or regulating the temperature to a reference temperature can be provided. The cooling section can further have a pre-cooling section 2b so that the band is pre-cooled upon cooling from ambient temperature to the superconducting temperature and/or a temporing section 2c to heat the band to ambient temperature more slowly after cooling and to be able to avoid thermally induced stresses in the band, condensate water deposits and the like.

The superconductor band 3 arranged the device can be of a length of several 100 meters. The length of the cooling section or the length of the band which is superconductingly cooled in the cooling section can respectively be for example in the range of between 1 and 10 m. The specified lengths are not limited to particular values. In this case the length of the band 3 is a multiple of the length of the superconductingly cooled band portion 3a. In general it is also possible to provide a band storage device to be able to continuously operate the installation.

The device according to the invention can be integrated in an installation for the production of superconductor bands so that there is provided an automatic band feed from an upstream-disposed part of the installation, as shown in FIG. 1, but the band can be arranged on a reel 4 and can be received by a winding-up reel 5 after passing through the cooling section.

The device 1 further has means 6 for the continuous movement of the band in the longitudinal direction thereof (transport means). Those means 6 can include drive means which are arranged upstream of and/or downstream of the cooling section, for example drives 6a, 6b for the unwinding and winding-up reels. In addition there can be provided drive means at the cooling section, for example in the form of the drives 6c, 6d for the rollers described hereinafter or separately provided transport rollers. The transport means are overall of such a configuration that mechanical loadings including tensile and/or compression loadings on the band are minimized. The transport means can provide for a continuous and uniform movement of the band at preferably a constant band speed through the cooling section over the entire length of the band or the period of investigation of the band so that band stoppage or a stationary arrangement of the band at the contact section described hereinafter does not occur. The band speed can be for example about 5 m/sec. The transport speed of the band, in particular within the cooling section and/or the contact section or measuring section, can be controlled or regulated by suitable means and the actual transport speed can be detected by the control device 10 in dependence on time over the period of investigation, and stored.

The device according to the invention includes a contact arrangement 20 having a plurality of electrical contacts 21 through 24 for contacting the cooled band portion. In that case the contacts 21 through 23 serve as feed contacts and the at least one contact 24 serves as a discharge contact, wherein the feed and discharge contacts which are spaced in the longitudinal direction of the band create an electric contact section, by means of which an electric transport current is produced in the longitudinal direction of the band in the band portion 3c which is contacted by that contact section. The arrangement of a plurality of feed contacts 21 through 23 arranged in succession in the longitudinal direction of the band means that a sufficiently high transport current can be introduced into the band (more precisely, the high-temperature superconductor layer of the band), even at relatively high band speeds, in order to produce in the superconductor layer a sufficient high electric current strength which is in the region of or higher than the minimum critical current strength Ic (min) to be fulfilled in respect of the specified quality demands. The feed and discharge contacts (and the measuring contacts described hereinafter) can be in the form of rollers which bear against the band or the superconductor layer over part of the periphery and preferably in slippage-free fashion. The contacts can also be designed in another way, for example in the form of sliding contacts.

Provided between the feed and discharge contacts is a voltage source 25 for producing the electric current between said contacts, wherein the transport current which is produced in the band can be produced in voltage-regulated or current-regulated fashion by means of the control/regulating system 26. In addition there is a display 27 for displaying the setting value for the transport current produced (current or voltage), wherein the values can be transmitted to the control device 10 continuously, possibly with suitable time cycling, which is preferably fast in relation to the band speed. The transport current can be fed into the bad continuously when the band is moving over the period of application of the method according to the invention or over the entire band length.

In addition the contact arrangement 20 includes a measuring arrangement 30 including a plurality of electric contacts 31, 32 for contacting the cooled band portion, more precisely the superconductor layer of the band, wherein the contacts 31, 32 are spaced from each other in the longitudinal direction of the band to form a measuring section over a part of the length of the band. In general the superconductor layer can also be covered with a conductive layer, for example a layer which is generally referred to as a "shunt", and which can also serve for protection for the superconductor layer from moisture. That electrically conducting covering or encasing layer can then also generally be contacted with the contacts forming the contact section and optionally the measuring section. A shunt however can also be omitted. The measuring contacts 31, 32 are signal-transmittingly connected to means 35 for detecting a physical measuring parameter on the basis of the transport current produced, in regard to the contacted band portion, wherein said transport current is produced by way of the electric contact arrangement. The physical measuring parameter in that respect is so selected that it represents a measurement in respect of the superconducting electric transport properties or the actual transport current of the band portion or a part thereof. The means 35 for detecting the physical measuring parameter in turn are connected to the control device 10 in signal-transmitting relationship to communicate the measuring parameter. If therefore for example a transport current is produced in the superconducting band portion in current-controlled relationship by way of the contact section then the voltage drop across the measuring section (contact spacing 31, 32) can be detected as the physical measuring parameter. If the transport current is produced in voltage-controlled fashion by way of the contact section, the physical measuring parameter can be the electric transport current flowing through the measuring section of the contacts 31, 32. It will be appreciated that the transport current produced can be respectively detected by another suitable physical measuring parameter, for example a physical parameter derived from the transport current or the voltage drop, like the electric resistance or the like.

To carry out the method according to the invention, a transport current is produced in the continuously moved band (that is to say the superconductor layer thereof), which current progresses continuously or step-wise in the longitudinal direction of the band during the movement thereof through the measuring section. In accordance with the invention therefore the transport current is preferably not interrupted in respect of time during the movement of the band through the measuring section, the band being of a length which is a multiple of the cooled band portions or a multiple of the length of the measuring section. Thus a quality assurance method in respect of HTS bands which permits a high band through-put is afforded by detection of the physical measuring parameter during ongoing band transport.

In general in accordance with the embodiment of the invention the transport current can be produced by a regulated voltage which for example can be constant or which can alter in time. The further description in regard to the (idealized) transport current therefore correspondingly applies to the regulated voltage for production of the transport current. The description relates generally—unless stated otherwise—to the idealized transport current as the response to the regulated voltage without having regard to irregularities in the superconducting material, which would lead to non-proportional changes in the transport current with the regulated voltage, or to the regulated transport current if for example the voltage drop is measured as a measurement in respect of the irregularities of the superconductor material.

By way of example the minimum critical transport current Ic (min) which is to be observed and which is defined in accordance with quality assurance can be applied in the form of a continuous current and the voltage drop in the band portion through which current flows is measured and checked by way of the measuring contacts functioning as voltage contacts to ascertain if it fulfills the superconduction criterion, for example being up to 1 µV/cm. When passing through the measuring section it is possible to display in a suitable device like the control device 10 and preferably to document in time-dependent fashion whether the quality criterion in regard to the respectively required minimum critical transport current is met at the respective moment in time of implementation of the method. Alternatively and preferably a voltage can also be applied in voltage-regulated fashion, which voltage produces a corresponding transport current having regard to the reference value to be expected in respect of the electric conductivity of the superconductor material.

In addition any local defects which limit the critical transport current of the superconductor layer of the band are located by the method according to the invention and by means of the device, more specifically with a positional resolution which is more accurate than the length of the contact and/or measuring section. If such a defect, when the band is being transported, passes into the contact section, that is to say between the feed and discharge contacts, the superconducting transport current within the superconductor layer will decrease to a greater or lesser degree or collapse. That can then be detected in the measuring section for example by a severe rise in voltage (current-regulated measurement) or a severe reduction in the transport current (voltage-regulated measurement) and displayed to the control device 10 in time-dependent relationship and/or stored. The region of the superconductor band or superconductor layer which passes into the contact arrangement and/or the measuring section can then be marked by suitable means 40 or that defective region can be ascertained by detecting or establishing the band speed by means of the device 50 over the period of investigation as from a given reference point and detect the investigation time from the reference point. In general marking can also be effected outside the cooling section with suitable tracking of the band location, for example with a known band speed and duration of the method. If the feed contacts 21, 22 or 22, 23 are spaced in the longitudinal direction of the band it is also possible to detect when a defect passes into the region between those contacts by means of the measuring device, and the change in signal including detection of the timing of the signal can be passed to the control device 10 in order to be able to locate the defect with knowledge of the band speed or by determining same. The defective band region can then be repaired by suitable measures, as described above, producing the required superconduction. It will be appreciated that, to achieve a sufficiently high degree of positional resolution, the contact section and the measuring section are of a suitable length and are respectively suitably matched to each other in their lengths.

In addition as shown in FIG. 2 further contact sections 50 with respectively associated measuring sections 52 (corresponding to the contact and measuring sections as described above) can be provided at the cooled band portion, which sections are operable independently of the first contact and measuring sections 20, 30 (with feed and discharge contacts 21, 24 and measuring contacts 31, 32) and can have mutually independent feed and discharge contacts 53, 54 and measuring contacts 55 and by which therefore a transport current of a different magnitude and/or with different time dependencies or time profiles is or can be produced in the portion 3*d* contacted by said contact section by suitable means 56, from those in the band portion 3*c*, in which case the physical measuring parameter dependent thereon can be detected in the device 58. In that way it is therefore possible to ascertain, and detect in dependence on time in the control device 10, whether a first minimum critical transport current is observed over the investigated length of band at a first contact arrangement 20, wherein an electric transport current Ic (min2) different from the first transport current can be produced in the band portion 3*d* at a second contact arrangement 50 in order to check whether there is a second minimum critical current strength as the transport current, which is different from the first-mentioned current strength Ic (min1). Investigation of the entire band is thus possible by band transport. As described hereinafter transport alternating currents with a defined time-dependent alternating current profile can be produced from an electric transport current of constant level (or a level which is as constant as possible). It is therefore possible by different contact arrangements at different band regions to produce transport currents involving different time profiles, for example a transport current of constant height can be produced at a first contact arrangement, a transport current which is superposed by a sinusoidal transport current of a frequency F1 and an amplitude A1 is produced at a further contact arrangement, a transport current of uniform height, which can be superposed by a transport alternating current of a frequency F2 and an amplitude A2 can occur at a further contact arrangement, wherein F1 can be unequal to F2 and/or A1 can be unequal to A2, or a trapezoidal transport alternating current or the like. That permits highly detailed quality control of the superconductor band. The transport alternating currents can here be produced in each case in current-regulated fashion or preferably voltage-regulated fashion.

The means 35, 58 for detecting the physical measuring parameter are thus of such a nature and are operated in such a way that they practically continuously detect the physical measuring parameter during the movement of the band in the longitudinal direction thereof, for example uninterruptedly in respect of time or also cyclically in respect of time if time cycling is effected at a substantially greater speed than the band speed, for example with a factor ≥2-4 or ≥10-20 or ≥50-100 or ≥1,000. The band is moved by means of the transport means at a constant band speed through the contact section and/or through the measuring section or during detection of the physical measuring parameter.

The feed and discharge conduits 21-24 (and/or optionally the measuring contacts) can at the same time be in the form of means for moving the band and for that purpose can couple to the band with their periphery in frictional engagement, possibly with the arrangement of counterpart rollers on the opposite side of the band. Optionally separate or additional means can generally also be provided for moving the band such as for example transport rollers. Here the band is looped in a meander path around the rollers 21-23 and can bear against them in line form or in areal relationship. The feed and discharge contacts have the drive means 6*c* and 6*d* for driving the band.

FIG. 3 shows a portion of a development of the device shown in FIGS. 1 and 2, which has a device 60 for producing a stationary magnetic field 61 in the form of a permanent magnetic field. The magnetic field produced in that way passes through the superconductor band 3 in the region of the contact and/or measuring section 20, 30 transversely or perpendicularly relative to the longitudinal direction of the band or the superconductor layer. That constricts the transport current to a cross-section smaller than the geometrical cross-section of the superconductor layer of the band. The current-constricted region 62 of the superconductor layer then forms the actual measuring section as the transport current is limited thereby. The feed, discharge and measuring contacts 21, 24, 31, 32 are thus arranged outside the magnetic field. The magnetic field is homogenous over the extent thereof in the longitudinal direction of the band and can be of a field strength of for example between 0.001 and 0.1 Tesla or between 0.05 and 0.09 Tesla, for example 0.025 T.

FIG. 4a shows a diagram of a transport current (base current Ig) with superposed alternating current component I' in relation to time t, that is to say a kind of modulation of the base current, in the presence of defects FS in the superconductor layer. The transport alternating current can be current-regulated or in particular produced by a regulated voltage, wherein the further description in relation to the alternating current correspondingly applies for the voltage insofar as irregularities in the superconducting material do not disturb a correlation of the voltage with the transport alternating current, such as for example defects.

The superposed alternating current component I' or the ac voltage component U' producing same is sinusoidal (the scalings of the U-axis and I-axis are different to show that voltage and produced current correlate and have the same time dependency). The frequency of the alternating current component/ac voltage component is greater than the quotient of band speed and contact or measuring section length, the amplitude A of the alternating current component is (not necessarily) lower than the level of the base current Ig. A corresponding consideration applies to the producing ac voltage component in relation to the base voltage. If a local defect FS1, FS2 involves a current peak in respect of the alternating current then the transport current is limited to a lower value Ic (minFS1), Ic (minFS2), which however can be higher than the minimum critical transport current Ic (min) (or the applied base current Ig), which leads to a corresponding change in the detected measuring parameter. The higher therefore the value "I" for the respective defect here, the correspondingly less is its disturbance potential in relation to limiting the transport current. Determining the position of the local defect on the band is then also possible by way of the number of periods of the transport alternating current, which is detected and implemented as from a predefined reference point on the band, or the time t1, t2. By virtue of the given band speed v the defects are then arranged, starting from the location on the band s=0 (entry of the band region into the contact or measuring section) at the time t=0, at the time t1 and t2 respectively at the position s1 or s2 respectively. The defects FS3 and FS4 at the position s3 or s4 are not detected. In that way therefore it is also possible to implement more extensive quality characterization of the band overall. In that case the defects FS3 and FS4 are not detected by the alternating current component. The ratio of the transport alternating current frequency to the ratio of band speed/measuring section length or band speed/contact section length can here be for example ≥1, for example 2-5 or more or 10-50. In this case the length of the contact section is a and the position on the band at the spacing a from the reference point (t=0, s=0) is s(a), as also in FIG. 4b.

FIG. 4b shows a diagram of a transport current (base current Ig) with superposed alternating current component I' in relation to time t corresponding to FIG. 4a, wherein in this case the superposed "alternating current component I'" is of a sawtooth shape. In this case also the transport alternating current can be current-regulated or in particular produced by a regulated voltage, in which respect attention is directed to the foregoing description relating in particular to FIG. 4a. The frequency of the alternating current component (or ac voltage component), that is to say the rise in the ramp to the maximum value, can here be equal to or greater than the quotient of band speed and contact or measuring section length so that for example precisely one ramp of the I/t profile or the U/t profile respectively is involved over the respective length of the band portion when passing through the contact or measuring section. In the case also the ratio of the sawtooth frequency to the ratio band speed/measuring section length or band speed/contact section length can possibly be for example ≥1-5, for example about 10-50. With a ratio of 1 therefore upon the passage of a band portion, with the length of the contact or measuring section, through the contact or measuring section, precisely one I/t ramp is impressed on the band portion. The amplitude A of the alternating current component (ac voltage component) is here too (not necessarily) less than the level of the base current Ig (base voltage Ug). As shown in FIG. 4b therefore the defects FS2, FS3 and FS4 are detected, with which the positions or spacings of the zero position s2, s3, s4 can be associated with a known band speed v and measurement of the time t2, t3, t4, but the defect FS1 at the position s1 cannot.

A particular situation of use is when voltage regulation of the transport current is implemented in such a way that, with a low current (voltage set lower) the HTC material is superconducting while with a high current (voltage set higher) the HTC material is normally conducting. The ac voltage producing the transport current can be for example of a sinusoidal or sawtooth profile. In that way for example the transitional range from the superconducting state into the non-superconducting (normally conducting) state of the superconducting band or in particular the width thereof can be investigated.

FIG. 5 shows a development of the device according to the invention as a diagrammatic plan view onto the band 3. For determining with the highest possible level of accuracy the critical current strength Ic (min) with an alternating current component in the measurement procedure the feed line 100 and the measuring lines 110 for voltage tapping are respectively passed in such a way that the inductive measuring voltage is minimized and the electrical connections between the feed and discharge contacts 23, 24 of the contact arrangement and between the two measuring contacts 31, 32 are passed in such a way that they produce induced magnetic fields M1 and M2 of opposite directions, of equal strength, on both sides of the measuring section (that is to say for example the areas enclosed by the lines are of equal size on both sides of the band). In addition there are provided compensation coils 120 producing magnetic fields to minimize the inductive component of the measuring signal, which can each be arranged in the region of the two halves of the contact and measuring section. Adjustment of the magnetic field strength of the compensation coils is effected by means of the actuating means 125 and the associated computer 130, as described hereinbefore, which also subtracts the inductive component of the current drop from the measuring signal, for which purpose there is provided a microcontroller, for example integrated in the actuating means 125. In the case also the transport current can be produced in current-regulated or preferably voltage-regulated fashion.

The invention claimed is:

1. A method for quality control of superconducting bands in respect of the critical current carrying capacity of the band, wherein the band is of a length l, the method comprising:
    a) cooling a portion of the superconductor band to a temperature at which said band portion becomes superconducting, wherein the length of the band is a multiple of a length of the cooled band portion,
    b) producing an electric transport current in the superconducting band portion in the longitudinal direction of the band by contacting with a contact arrangement which has electric feed and discharge contacts spaced in the longitudinal direction of the band to produce the transport current between them via a transport current producing device, wherein the transport current is produced in voltage-regulated fashion, wherein the voltage producing the transport current is regulated to a constant value or in time-dependent relationship,
    c) arranging a measuring arrangement which is sensitive with respect to the transport current on the band or the transport current producing device or both for detecting a transport current-dependent physical measuring parameter, the measuring arrangement including at least two measuring contacts which are applied to the cooled band portion and spaced apart in the longitudinal direction, the measuring contacts being provided on the contact arrangement and providing a measuring section over the length or a part of the length of the cooled band portion,
    d) continuously moving at least a part of the band in the longitudinal direction of the band through the contact arrangement or the measuring arrangement or through both with electric contacting of the moved band to produce the transport current which progresses through the band in the longitudinal direction thereof, and
    e) detecting the physical measuring parameter on the basis of the produced transport current in relation to the measuring arrangement via measuring contacts thereof during the movement of at least a part of the band through the measuring section, wherein the physical measuring parameter is a measurement in respect of the superconducting electric transport properties of the band portion or a part of the band,
    wherein produced in the cooled band portion is an electric transport current in the form of an alternating current or an ac voltage producing a transport alternating current or both, the frequency of the alternating current or ac voltage being equal to or greater than the quotient of (i) the band speed of the moved band and (ii) the length of the measuring section in the longitudinal direction of the band, which is respectively associated with the given band portion, or the length of the contact section over which the transport current is produced.

2. The method as set forth in claim 1 wherein the electric transport alternating current is superposed on the transport current which is constant or changes in dependence on time and the physical measuring parameter is detected on the basis of the resulting superposed transport current.

3. The method as set forth in claim 1 wherein the frequency of the transport alternating current produced or the ac voltage producing same or both is in the range of between 0.2 and 200 Hz.

4. The method as set forth in claim 1 wherein the frequency of the transport alternating current produced or the ac voltage producing same or both is greater by the factor of between 1.01 and 2,000 than the quotient of (i) the band speed of the moved band and (ii) the length of the measuring section in the longitudinal direction of the band, which is respectively associated with the given band portion, or the length of the contact section over which the transport current is produced.

5. The method as set forth in claim 1 wherein a magnetic field passing through the superconducting band is produced, by which the transport current is constricted to a cross-section smaller than the geometrical cross-section of the superconducting layer of the band, that is acted upon with the transport current, and the physical measuring parameter is detected in the region of the band with the constricted transport current.

6. The method as set forth in claim 1 wherein the physical measuring parameter is detected continuously during the movement of the band over a length which is a multiple of the band portion length.

7. The method as set forth in claim 1 wherein a plurality of electric contacts of the same polarity are applied as feed contacts at the same time against the band in electrically contacting relationship in order to feed a plurality of partial currents into the band to produce an electric transport current in the band.

8. The method as set forth in claim 1 wherein the method is carried out in the transitional range from the superconducting to the non-superconducting state of the superconducting band.

9. The method as set forth in claim 1 wherein the method is carried out on a superconducting band having a superconducting layer which is not provided with an electric shunt or which at least partially comprises a ferri-/ferromagnetic material or both.

10. A method for quality control of superconducting bands in respect of the critical current carrying capacity of the band, wherein the band is of a length 1, the method comprising:
    a) cooling a portion of the superconductor band to a temperature at which said band portion becomes superconducting, wherein the length of the band is a multiple of a length of the cooled band portion,
    b) producing an electric transport current in the superconducting band portion in the longitudinal direction of the band by contacting with a contact arrangement which has electric feed and discharge contacts spaced in the longitudinal direction of the band to produce the transport current between them via a transport current producing device, wherein the transport current is produced in voltage-regulated fashion, wherein the voltage producing the transport current is regulated to a constant value or in time-dependent relationship,
    c) arranging a measuring arrangement which is sensitive with respect to the transport current on the band or the transport current producing device or both for detecting a transport current-dependent physical measuring parameter, the measuring arrangement including at least two measuring contacts which are applied to the cooled band portion and spaced apart in the longitudinal direction, the measuring contacts being provided on the contact arrangement and providing a measuring section over the length or a part of the length of the cooled band portion,
    d) continuously moving at least a part of the band in the longitudinal direction of the band through the contact arrangement or the measuring arrangement or through both with electric contacting of the moved band to produce the transport current which progresses through the band in the longitudinal direction thereof, and
    e) detecting a physical measuring parameter on the basis of the produced transport current in relation to the measuring arrangement via measuring contacts thereof during the movement of at least a part of the band through the measuring section, wherein the physical measuring parameter is a measurement in respect of the superconducting electric transport properties of the band portion or a part of the band, wherein there are provided two or more contact arrangements for producing a respective transport current in the superconductingly cooled band, by which mutually independent transport currents are produced in the respective cooled band portion, and the physical measuring parameter is detected in the various regions of the band portion with an association with the various transport currents.

11. A device for quality control of superconducting bands, comprising:
   a) a cooling section for cooling a portion of the band to a temperature at which said band portion becomes superconducting, the length of the band being a multiple of a length of the cooled band portion,
   b) a contact arrangement including a plurality of electric contacts for contacting the cooled band portion, wherein the electric contacts have at least one feed contact and at least one discharge contact, which are spaced from each other to provide a contact section in the longitudinal direction of the band,
   c) a device for producing an electric transport current in the contacted band portion via the feed and discharge contacts, wherein there is provided a regulatable voltage source for producing the transport current, wherein the voltage producing the transport current is regulated to a constant value or in time-dependent relationship,
   d) a measuring arrangement for detecting a transport current-dependent physical parameter, including at least two measuring contacts which are applied to the superconducting band portion acted upon with the transport current and spaced apart in the longitudinal direction, the measuring contacts being provided on the contact arrangement and providing a measuring section over the length or a part of the length of the band portion acted upon with the transport current,
   e) a mechanism configured to move at least a part of the band in the longitudinal direction thereof through the contact section with continuous electric contacting of the moved band, wherein the mechanism is configured to produce the transport current which progresses through the band in the longitudinal direction thereof, and
   f) a detector configured to detect a physical measuring parameter on the basis of the transport current produced in the band portion via the measuring contacts during a movement of at least a part of the band through the measuring section, wherein the physical measuring parameter is so selected that it permits a measurement of the superconducting electric transport properties of the band portion or a part of the band,
   wherein the contact arrangement has more than two feed contacts respectively associated with a common discharge contact and the contacts are so arranged that a plurality of transport currents of differing current strength are simultaneously produced in different regions of the cooled band portion and the detector is so adapted that the physical measuring parameter is detected in the various regions of the band portion with a differing transport current strength, with association with said band portions.

12. The device as set forth in claim 11 wherein the device for producing the transport current is adapted to produce a transport current which is constant or which changes in dependence on time.

13. The device as set forth in claim 11 wherein the device for producing the transport current is so adapted that a transport current in the form of an alternating current is produced in the band, which current is produced in the same band portion at the same time with a transport current of constant or uniformly changing transport current strength, and the detector is adapted to detect the physical measuring parameter resulting from the transport alternating current or from the superposed transport current.

14. A device for quality control of superconducting bands, comprising:
   a) a cooling section for cooling a portion of the band to a temperature at which said band portion becomes superconducting, the length of the band being a multiple of a length of the cooled band portion,
   b) a contact arrangement including a plurality of electric contacts for contacting the cooled band portion, wherein the electric contacts have at least one feed contact and at least one discharge contact, which are spaced from each other to provide a contact section in the longitudinal direction of the band,
   c) a device for producing an electric transport current in the contacted band portion via the feed and discharge contacts, wherein there is provided a regulatable voltage source for producing the transport current, wherein the voltage producing the transport current is regulated to a constant value or in time-dependent relationship,
   d) a measuring arrangement for detecting a transport current-dependent physical parameter, including at least two measuring contacts which are applied to the superconducting band portion acted upon with the transport current and spaced apart in the longitudinal direction, the measuring contacts being provided on the contact arrangement and providing a measuring section over the length or a part of the length of the band portion acted upon with the transport current,
   e) a mechanism configured to move at least a part of the band in the longitudinal direction thereof through the contact section with continuous electric contacting of the moved band, wherein the mechanism is configured to produce the transport current which progresses through the band in the longitudinal direction thereof, and
   f) a detector configured to detect a physical measuring parameter on the basis of the transport current produced in the band portion via the measuring contacts during a movement of at least a part of the band through the measuring section, wherein the physical measuring parameter is so selected that it permits a measurement of the superconducting electric transport properties of the band portion or a part of the band,
   wherein the device for producing the transport current is adapted such that the device produces a transport current in the form of an alternating current in the cooled band portion and is so adapted that an alternating current or an ac voltage is produced at a frequency in the range of between 0.2 and 200 Hz.

15. The device as set forth in claim 14 wherein there is provided a magnetic field producing device that produces a magnetic field passing through the cooled band portion, by which the transport current is constricted to a cross-section smaller than the geometrical cross-section of the superconducting band region in the longitudinal direction of the band, and the detector is so arranged that the physical measuring parameter is detected in the region of the band with the constricted transport current.

16. The device as set forth in claim 14 wherein there is provided a device for impressing a constant voltage, producing an electric transport current, on the cooled band portion during the movement thereof through the measuring section, and the detector is so adapted that the voltage-induced electric transport current or a physical parameter derived therefrom is detected in positionally resolved relationship during the band movement.

17. The device as set forth in claim 14 wherein there is provided a device, through which the physical measuring parameter is detected with a positional resolution greater than the length of the measuring section in relation to a band portion arranged at a moment in time at the measuring section or with a positional resolution greater than the contact section length in relation to a band portion arranged at a moment in time at the contact section or both.

18. The device as set forth in claim 14 wherein the detector is adapted to detect the physical measuring parameter continuously or step-wise during the movement of the band in the longitudinal direction thereof.

19. The device as set forth in claim 14 wherein the moving mechanism has entrainment members adapted for frictionally engaging coupling to the band or which frictionally engagingly couple to the band in order to move the band through the measuring section or to act on the band during its movement with a defined bias voltage or both.

20. The device as set forth in claim 19 wherein the moving mechanism or the electric contacts of the contact arrangement or the at least one measuring sensor or a plurality or all thereof are so adapted that at least some respective ones thereof bear against the band in line form (in relation to the longitudinal direction of the band) or in areal relationship.

21. The device as set forth in claim 14 wherein the electric contact arrangement includes a plurality of electric contacts of the same polarity which are simultaneously applied in electrically contacting relationship against the band to produce in the band one or more independent electric transport currents.

* * * * *